United States Patent [19]
Gonikberg et al.

[11] Patent Number: 6,018,755
[45] Date of Patent: Jan. 25, 2000

[54] EFFICIENT IMPLEMENTATION OF AN FIR FILTER ON A GENERAL PURPOSE PROCESSOR

[75] Inventors: Mark Gonikberg, Santa Clara; Haixiang Liang, San Jose, both of Calif.

[73] Assignee: Altocom, Inc., Mountain View, Calif.

[21] Appl. No.: 08/748,854

[22] Filed: Nov. 14, 1996

[51] Int. Cl.$^7$ ........................................ G06F 17/10
[52] U.S. Cl. ............................ 708/319; 708/303
[58] Field of Search ..................... 708/319, 303, 708/300

[56] References Cited

U.S. PATENT DOCUMENTS 5,047,972  9/1991  Wada ........................................ 708/319
5,050,118  9/1991  Inoue et al. .............................. 708/303

*Primary Examiner*—Tan V. Mai
*Attorney, Agent, or Firm*—Zagorin, O'Brien & Graham, LLP

[57] ABSTRACT

A Finite Impulse Response (FIR) filter is implemented in software on a general purpose processor in a manner which reduces the number of memory accesses as compared to conventional methods. In particular, an efficient implementation for a general purpose processor having a substantial number of registers includes inner and outer loop code which together make $$K\left[\left(\frac{L_1 + L_2}{L_1 L_2}\right)N + \frac{L_2}{L_1} + 1\right]$$

memory accesses and KN multiply-accumulates, where $L_1$ is the number of output vector elements computed during each pass through the outer loop and where $L_2$ is the number of taps per output vector element computed during each pass through the inner loop. The efficient implementation exploits $L_1 + 2L_2$ general purpose registers. For an embodiment in which $L_1 = L_2 = 8$, inner and outer loop code make $$K\left(\frac{N}{4} + 2\right)$$

memory accesses, which for filter implementations with large numbers of taps, approaches a 4× reduction in the number of memory accesses as compared to conventional methods.

22 Claims, 4 Drawing Sheets

EFFICIENT IMPLEMENTATION OF AN FIR FILTER ON A GENERAL PURPOSE PROCESSOR

BACKGROUND OF THE INVENTION

1. Field of the Invention

This invention relates to software implementations of discrete time filters, and in particular to software implementations of a Finite Impulse Response (FIR) filter on a general purpose processor.

2. Description of the Relevant Art

Traditional implementations of discrete time filters for signal processing applications have used a custom Digital Signal Processor (DSP) instruction to implement an N-tap filter. Such a DSP instruction is executed to perform a multiply-accumulate operation and to shift the delay line in a single cycle (assuming the delay line is entirely in zero-wait state memory or on-chip). For example, on a TI320C50 DSP, a finite impulse response (FIR) filter is implemented by successive evaluations of an MACD instruction, each evaluation computing an element, $y_n$, of the filtered signal vector, i.e., of the output vector, y[K], such that:

$$y_n = \sum_{i=0}^{N-1} h_i x_{n-i} \tag{1}$$

where h[N] is the N-tap filter coefficient vector and x[K] is an input signal vector.

Unfortunately, for many portable device applications such as Personal Digital Assistants (PDAs), portable computers, and cellular phones, power consumption, battery life, and overall mass are important design figures of merit. In addition, very small part counts are desirable for extremely-small, low-cost consumer devices. Signal processing capabilities are desirable in many such portable device applications, for example to provide a modem or other communications interface, for speech recognition, etc. However, traditional DSP implementations of such signal processing capabilities create increased power demands, increase part counts, and because of the power consumption of a discrete DSP, typically require larger heavier batteries.

SUMMARY OF THE INVENTION

An efficient implementation of a Finite Impulse Response (FIR) filter on a general purpose processor allows a discrete Digital Signal Processor (DSP), together with the cost, size, weight, and power implications thereof, to be eliminated in device configurations (such as communications device configurations) requiring signal processing functionality and digital filter structures. In particular, an efficient implementation of an FIR in accordance with the present invention allows a single general purpose processor (e.g., any of a variety of processors including MIPS R3000, R4000, and R5000 processors, processors conforming to the Sparc, PowerPC, Alpha, PA-RISC, or x86 processor architectures, etc.) to execute instructions encoded in a machine readable media to provide not only application-level functionality, but also the underlying signal processing functionality and digital filter structures for a communications device implementation. Of course, multiprocessor embodiments (i.e., embodiments including multiple general-purpose processors) which similarly eliminate a DSP are also possible. In one embodiment in accordance with the present invention, an FIR filter implementation on a general purpose processor provides digital filter structures for a software implementation of a V.34 modem without use of a DSP.

In general, a general purpose processor provides an instruction set architecture for loading data to and storing data from general purpose registers, for performing logical and scalar arithmetic operations on such data, and providing instruction sequence control. Application programs, as well as operating systems and device drivers, are typically executed on such a general purpose processor. In contrast, a digital signal processor is optimized for vector operations on vector data, typically residing in large memory arrays or special purpose register blocks, and is not well suited to the demands of application programs or operating system implementations. Instead, a digital signal processor typically provides a vector multiply-accumulate operation which exploits highly-optimized vector addressing facilities. In contrast, a general purpose processor provides neither a vector multiply-accumulate operation nor vector addressing facilities necessary for computing a $y_n$th element and shifting through vector data in a single cycle. Instead, an N-tap filter implemented in a straightforward manner for execution on a general purpose processor computes each output vector element using 2N reads from memory to processor registers, N multiply-accumulates, and one write to memory. To calculate K elements, such an N-tap filter implementation makes K(2N+1) memory accesses and KN multiply-accumulates. For each multiply-accumulate, more than two memory access are required.

It has been discovered that a Finite Impulse Response (FIR) filter can be implemented in software on a general purpose processor in a manner which reduces the number of memory accesses. In particular, an efficient implementation for a general purpose processor having a substantial number of registers includes inner and outer loop code which together make $$K\left[\left(\frac{L_1 + L_2}{L_1 L_2}\right)N + \frac{L_2}{L_1} + 1\right]$$

memory accesses and KN multiply-accumulates, where $L_1$ is the number of output vector elements computed during each pass through the outer loop and where $L_2$ is the number of taps per output vector element computed during each pass through the inner loop. The efficient implementation exploits $L_1+2L_2$ general purpose registers. For an exemplary embodiment wherein $L_1=L_2=8$, i.e., using 24 general purpose registers, inner and outer loop code make $$K\left(\frac{N}{4} + 2\right)$$

memory accesses, which for filter implementations with large numbers of taps, approaches a 4× reduction in the number of memory accesses.

BRIEF DESCRIPTION OF THE DRAWINGS

The present invention may be better understood, and its numerous objects, features, and advantages made apparent to persons of ordinary skill in the art by referencing the accompanying drawings.

The use of the same reference symbols in different drawings indicates similar or identical items.

DESCRIPTION OF THE PREFERRED EMBODIMENT(S)

An N-tap filter implemented as software for execution on a general purpose processor computes each output vector element using 2N reads from memory to processor registers, N multiply-accumulates, and one write to memory. To calculate K elements, such an N-tap filter implementation includes K(2N+1) memory accesses and KN multiply-accumulates. For each multiply-accumulate, more than two memory access are required.

Figure 1:
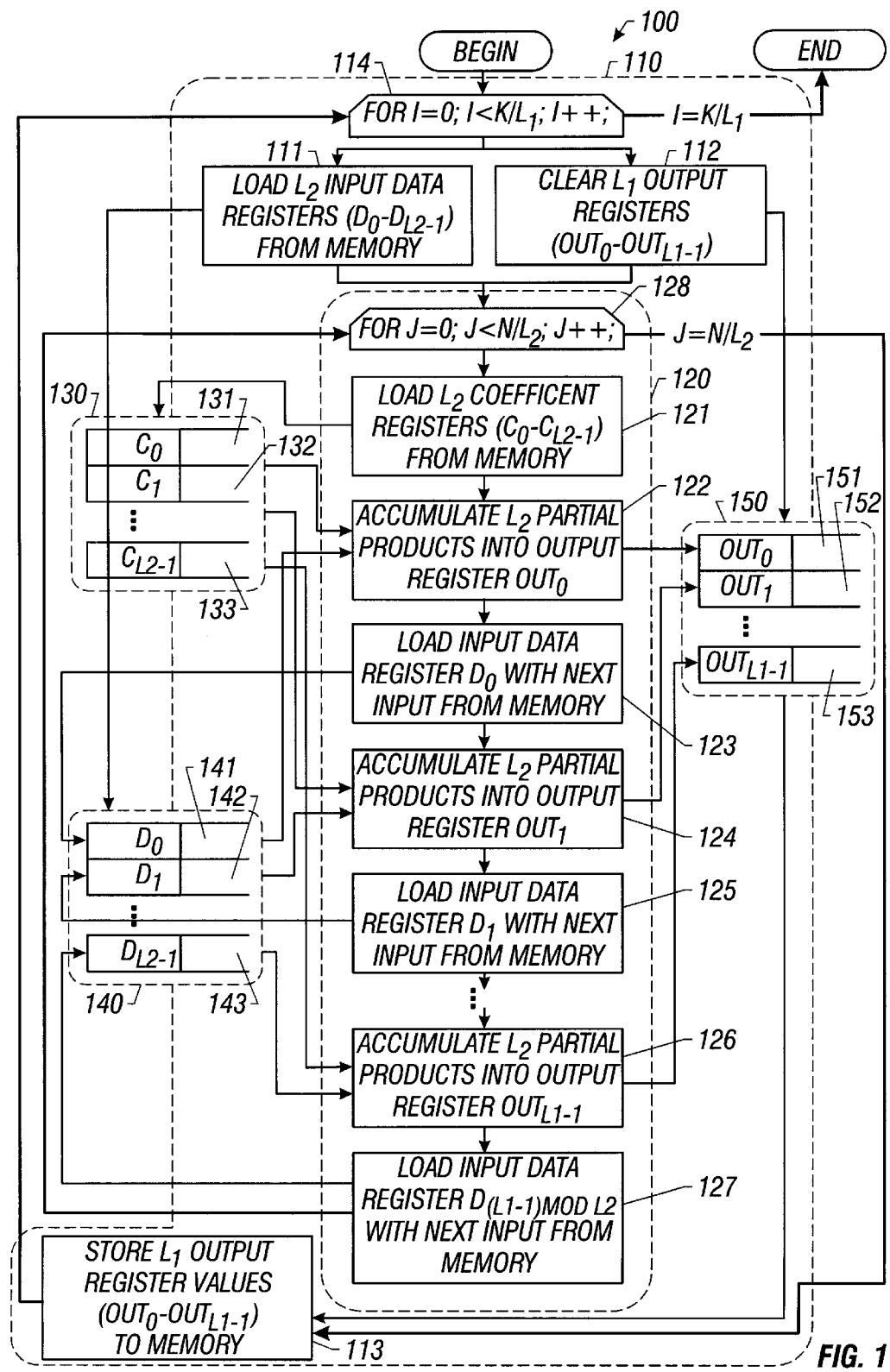
FIG. 1 is a flow chart of an implementation of a Finite Impulse Response (FIR) filter, in accordance with an exemplary embodiment of the present invention, for execution on a processor.

In contrast, an improved software implementation of the N-tap filter reduces the number of memory accesses. Referring to FIG. 1, the improved software implementation includes an inner loop 120 and an outer loop 110 which together include $$K\left[\left(\frac{L_1+L_2}{L_1 L_2}\right)N + \frac{L_2}{L_1} + 1\right]$$

memory accesses and KN multiply-accumulates, where $L_1$ is the number of output vector elements computed during each pass through outer loop 120 and where $L_2$ is the number of taps per output vector element computed during each pass through inner loop 110. The improved software implementation efficiently exploits $L_1+2L_2$ general purpose registers and significantly reduces the number of memory accesses performed. In particular, for an exemplary embodiment wherein $L_1=L_2=8$, i.e., using 24 general purpose registers, inner and outer loop code make $$K\left(\frac{N}{4}+2\right)$$

memory accesses, which for filter implementations with large numbers of taps, approaches a 4× reduction in the number of memory accesses.

FIG. 1 depicts an exemplary embodiment of a nested loop implementation, including control flows (bold lines) and data flows (fine lines), of an N-tap filter design for a Finite Impulse Response filter (FIR). Outer loop 110 includes $K/L_1$ iterations to compute K output values of an output signal vector, OUT[K]. During each iteration of outer loop 110, input registers 140 are loaded with $L_2$ (of K) respective input values of an input signal vector, D[K], from memory (step 111). Output registers 150 store $L_1$ (of K) respective output values of the output signal vector, OUT[K], and are cleared in step 112. Inner loop 120 includes $N/L_2$ iterations to accumulate partial products into output registers 150 storing a subset of output values OUT[($iL_1$) ... ($iL_1+L_1-1$)] of the output signal vector OUT[K] where i is the loop index variable for outer loop 110. The structure of inner loop 120 is described below. Loop index variable j is checked during each pass through inner loop 120 (illustratively, in step 128). On inner loop exit (i.e., on $j=N/L_2$ in the exemplary embodiment of FIG. 1), the subset of output values computed by inner loop 120 and accumulated into output registers 150 are stored to memory (step 113) and a subsequent iteration (if any) of outer loop 110 is initiated. In the exemplary embodiment of FIG. 1, outer loop exit is on $i=K/L_1$.

Coefficient registers 130 provide storage for $L_2$ (of N) filter coefficients of a filter coefficient vector C[N]. During each iteration of inner loop 120 (in particular, during step 121), coefficient registers 130 are loaded with a subset C[($jL_2$) ... ($jL_2+L_2-1$)] of the values from the filter coefficient vector, C[N], from memory. Inner loop 120 includes $N/L_2$ iterations to accumulate partial products of filter coefficient values and input signal vector values into a subset of output points OUT[($iL_1$) ... ($iL_1+L_1-1$)] of the output signal vector OUT[K]. $L_2$ element subsets of the filter coefficient vector and of the input signal vector are processed during each iteration through inner loop 120. Inner loop 120 also includes accumulation steps (e.g., accumulation steps 122, 124, and 126) and input data load steps (e.g., input data load steps 123, 125, and 127). After each accumulate step, processing of a particular element of the input signal vector, D[K], is complete and the register used for storage of that particular element is available for storage of an as-yet unloaded element of the input signal vector. Each input data load step (e.g., input data load step 123, 125, or 127) loads a next successive element of the input signal vector into a corresponding input register location (illustratively, input register $D_0$ 141, $D_1$ 142, or $D_{L_2-1}$ 143) freed up during the prior accumulation step. During each iteration of inner loop 120, $L_2$ partial products are accumulated into $L_1$ output registers 150 (i.e., into the $L_1$ output registers $OUT_0$ 151, $OUT_1$ 152, ... $OUT_{L_1-1}$ 153).

FIG. 1 depicts an exemplary N-tap filter implementation 100 where the number of output vector elements computed and input vector elements consumed during each pass through outer loop 110 is $L_1$ and the number of partial products of input vector elements and filter coefficients accumulated during each pass through inner loop 120 is $L_2$. The numbers $L_1$ and $L_2$ are independent, although $L_1$ should be a multiple of $L_2$ and the quantity ($L_1+2L_2$) should be less or equal to than the total number of registers allocable to the N-tap filter implementation 100 on a particular processor.

For an embodiment wherein $L_1=L_2=8$, the steps of the N-tap filter implementation of FIG. 1 correspond to the following pseudocode:

```
/* compute L_1=8 output points per iteration */ OUTER_
   LOOP {
   clear 8 output registers OUT_0,OUT_1, ... OUT_7;
   load 8 input from memory to registers D_0,D_1, ... ,D_7;
   /* compute L_2=8 partial outputs */ INNER_LOOP {
      load 8 coefficients from memory to registers C_0,C_1,
         ... ,C_7;
      OUT_0+=C_0*D_0+C_1*D_1+ ... +C_7*D_7;
      load new input from memory to D_0;
      OUT_1+=C_0*D_1+C_1*D_2+ ... +C_7*D_0;
      load new input from memory to D_1;
      OUT_2+=C_0*D_2+C_1*D_3+ ... +C_7*D_2;
      load new input from memory to D_2; ...
      OUT_7+=C_0*D_7+C_1*D_0+ ... +C_7*D_6;
      load new input from memory to D_7; }
``` store 8 outputs from registers $OUT_0, OUT_1, \ldots, OUT_7;$ }
A variety of source-code, assembly language, and machine language implementations consistent with the above pseudocode will be appreciated by persons of ordinary skill in the art. Alternative embodiments corresponding to different combinations of $L_1$ and $L_2$ values will also be appreciated by persons of ordinary skill in the art. Preferably, $L_1$ and $L_2$ are chosen so that the total number of general purpose registers allocated to storage of a partial input signal vector, a partial filter coefficient vector, and a partial output signal vector approaches the number of available general purpose registers on a general purpose processor. In an embodiment for execution on a Reduced Instruction Set Computer (RISC) processor providing overlapping register sets, $L_1$ and $L_2$ are preferably chosen so that the total number of general purpose registers allocated to storage of the partial input signal, partial filter coefficient, and partial output signal vectors approaches the number of available general purpose registers in a register set.

Figure 2:
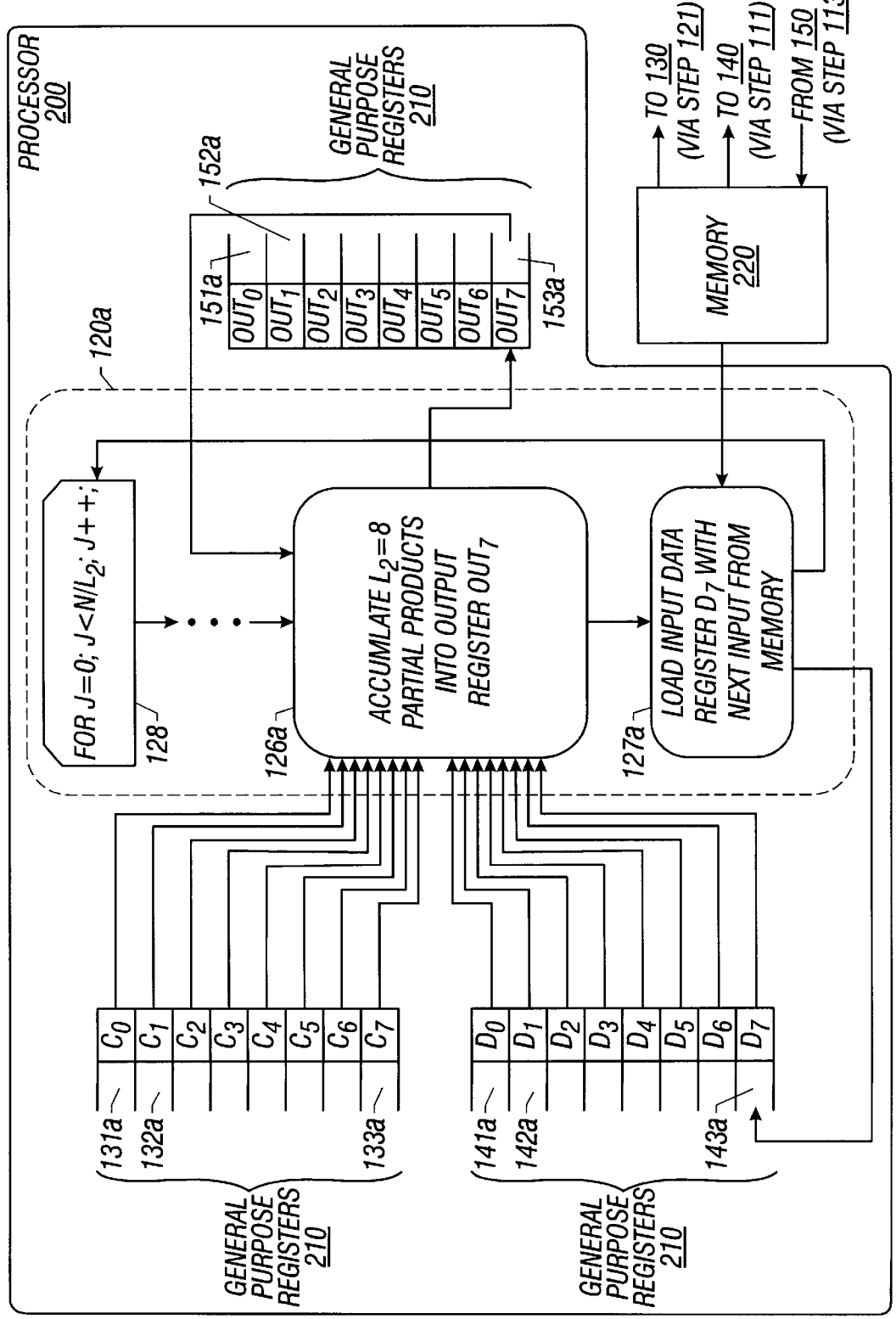
FIG. 2 is a data flow diagram for a multiply accumulate step of an implementation of a Finite Impulse Response (FIR) filter for execution on system including a processor with general purpose registers and a memory, in accordance with an exemplary embodiment of the present invention.

FIG. 2 depicts the data flows associated with an accumulation step and an input data load step from an iteration of inner loop 120. In particular, FIG. 2 depicts the data flows associated with the final two steps in each iteration of inner loop 120 (i.e., accumulation step 126 and input data load step 127, as shown in FIG. 1) for an exemplary embodiment in which $L_1=8$ and $L_2=8$. Inner loop instance 120a, accumulation step instance 126a, and input data load step instance 127a correspond to this exemplary embodiment in which $L_1=8$ and $L_2=8$. The exemplary embodiment of FIG. 2 exploits twenty-four (24) general purpose registers 210 and is illustrative of the data flows for accumulation step instance 126a and input data load step instance 127a. The data flows associated with each of seven other preceding accumulation and input data load steps are analogous and will be appreciated by persons of ordinary skill in the art. In addition, persons of ordinary skill in the art will appreciate modification for alternate selections of $L_1$ and $L_2$ values.

Inner loop 120a code and outer loop 110 code (not shown) each execute on processor 200, which illustratively includes a general purpose processor with at least 24 general purpose registers 210. A first group ($C_0$ 131a, $C_1$ 132a, ... $C_7$ 133a) of general purpose registers 210 are allocated to storage of a working set of eight (8) filter coefficient values from filter coefficient vector C[N]. A second group ($D_0$ 141a, $D_1$ 142a, ... $D_7$ 143a) of general purpose registers 210 are allocated to storage of a working set of eight (8) input values from input signal vector D[K]. A third group ($OUT_0$ 151a, $OUT_1$ 152a, ... $OUT_7$ 153a) of general purpose registers 210 are allocated to accumulative storage of partial convolutions for eight (8) output values of output vector C[N]. Initialization of the first group ($C_0$ 131a, $C_1$ 132a, ... $C_7$ 133a) and the second group ($D_0$ 141a, $D_1$ 142a, ... $D_7$ 143a) of general purpose registers 210 with values from memory, such as memory 220, is performed in steps 111 (of outer loop 110) and 121 (of inner loop 120), as indicated in FIG. 1. A third group ($OUT_0$ 151a, $OUT_1$ 152a, ... $OUT_7$ 153a) of general purpose registers 210 is cleared in step 112 and stored to memory 220 in step 113 (both of outer loop 110).

Accumulation step instance 126a convolves the then-present contents of the first group ($C_0$ 131a, $C_1$ 132a, ... $C_7$ 133a) of general purpose registers 210 with the then-present contents of the second group ($D_0$ 141a, $D_1$ 142a, ... $D_7$ 143a) of general purpose registers 210. For the particular accumulate step performed by accumulation step instance 126a, a partial filter coefficient vector $C[(jL_2) \ldots (jL_2+L_2-1)]$ is a convolved with a partial input signal vector $D[(iL_1+jL_2-1), (iL_1+jL_2), \ldots (iL_1+jL_2+L_2-2)]$, as follows:

$$OUT_7 += C_0 D_7 + C_1 D_0 + C_2 D_1 + C_3 D_2 + C_4 D_3 + C_5 D_4 + C_6 D_5 + C_7 D_6 \quad (2)$$

where j is the loop index for inner loop 120a and where $C_0$ 131a, $C_1$ 132a, ..., and $C_7$ 133a respectively contain elements of the partial filter coefficient vector $C[(jL_2) \ldots (jL_2+L_2-1)]$. Input registers 140 (i.e., $D_7$ 143a, $D_0$ 141a, $D_1$ 142a, ..., and $D_6$) respectively contain elements of the partial input signal vector $D[(iL_1+jL_2-1), (iL_1+jL_2), \ldots (iL_1+jL_2+L_2-2)]$ where i is the loop index for outer loop 110 and where elements are stored as shown in Table 1.

TABLE 1

| Register | Input Signal Vector Element |
| --- | --- |
| Input Register $D_0$ 141a | $D[iL_1+jL_2]$ |
| Input Register $D_1$ 142a | $D[iL_1+jL_2+1]$ |
| Input Register $D_2$ | $D[iL_1+jL_2+2]$ |
| Input Register $D_3$ | $D[iL_1+jL_2+3]$ |
| Input Register $D_4$ | $D[iL_1+jL_2+4]$ |
| Input Register $D_5$ | $D[iL_1+jL_2+5]$ |
| Input Register $D_6$ | $D[iL_1+jL_2+6]$ |
| Input Register $D_7$ 143a | $D[iL_1+jL2-1]$ |

Input data load step instance 127a loads the input register $D_7$ 143a with the next successive element, i.e., $D[iL_1+jL_2+7]$, of input signal vector D[K]. In this way, second group ($D_0$ 141a, $D_1$ 142a, ... $D_7$ 143a) of general purpose registers 210 is ready for the next pass through inner loop 120a.

Figure 3:
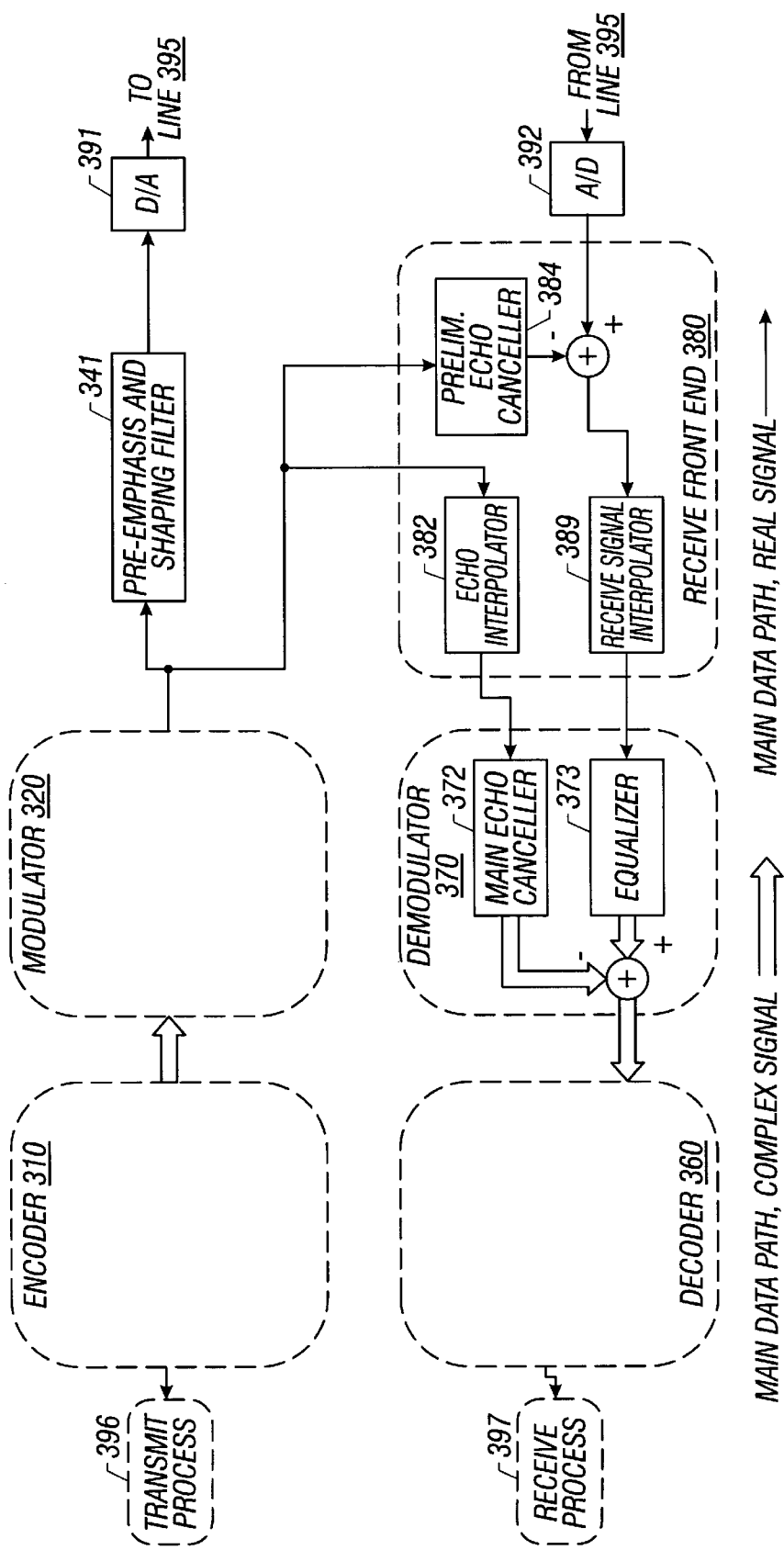
FIG. 3 is a functional block diagram depicting functional modules and data flows for a software implementation of a modem incorporating instantiations of a Finite Impulse Response (FIR) filter implemented in accordance with an exemplary embodiment of the present invention.

Referring to FIG. 3, software implementation 300 of a V.34 modem includes transmit and receive data paths. The transmit data path includes encoder 320, modulator 330, and pre-emphasis and shaping filter 341. The receive data path includes receive data module 350, decoder 360, demodulator 370, and receive front and module 380. A transmit process 396 invokes an external data handler with data for transmission over line 395. Along the transmit data path, pre-emphasis and shaping filter 341 is implemented using a FIR filter 100 as described above in accordance with FIGS. 1 and 2. Along the receive data path, echo interpolator 381, preliminary echo canceller 384, main echo canceller 371, and equalizer 373 are also implemented using a FIR filter 100 as described above in accordance with FIGS. 1 and 2.

In an exemplary embodiment of software implementation 300 of a V.34 modem, pointers to an input signal vector, D[K], to a coefficient vector, C[N], and an output signal vector, OUT[K], are passed to a function, procedure, or method implementing FIR filter 100. Each of the submodules which are implemented using FIR filter 100, i.e., shaping filter 341 along the transmit data path and echo interpolator 381, preliminary echo canceller 384, main echo canceller 371, and equalizer 373 along the receive data path, are invoked with input data passed from a predecessor in the respective data path and with coefficient data specific to the particular filter implementation. Both the input data and the filter-specific coefficient data are passed via memory 220. Suitable filter coefficient vectors are specific to each of the particular filters and will be appreciated by persons of ordinary skill in the art. Certain filter implementations are adaptive and FIR filter 100 is instantiated or invoked with coefficient vectors which are updated to implement each of the respective adaptive filters. Each of the instantiations or invocations of FIR filter 100 code which implement a particular filter along the transmit or receive data path may independently define $L_1$ and $L_2$ values for efficient implementation thereof.

Referring now to the transmit data path of software implementation 300, transmit process 396 supplies a bit stream to a V.34 implementation of encoder 320. Encoder 320 converts the input bit stream into a baseband sequence of complex symbols which is used as input to modulator 330. Encoder 320 performs shell mapping, differential encoding, constellation mapping, preceding and 4D trellis encoding, and nonlinear encoding, all as described in respective sections of ITU-T Recommendation V.34, *A Modem Operating at Data Signalling Rates of up to 28 800 bits/s for Use on the General Switched Telephone Network and on Leased Point-to-Point 2-Wire Telephone-Type Circuits*, dated September, 1994 (previously CCITT Recommendation V.34), which is hereby incorporated herein, in its entirety, by reference. Persons of ordinary skill in the art will recognize variety of alternative implementations of encoder 320, in accordance with the requirements of ITU-T Recommendation V.34 (hereafter the V.34 recommendation). In addition, persons of ordinary skill in the art will recognize a variety of alternative configurations of encoder 320 suitable to modem implementations in accordance with other communications standards such as V.32, V.32bis, etc. Returning to the V.34 embodiment of FIG. 3, encoder 320:

1. converts the input bit stream into a sequence of mapping frames as described in section 9.3 of the V.34 recommendation, which is incorporated herein by reference;
2. performs shell mapping as described in section 9.4 of the V.34 recommendation, which is incorporated herein by reference;
3. performs differential encoding as described in section 9.5 of the V.34 recommendation, which is incorporated herein by reference;
4. performs constellation mapping as described in section 9.1 of the V.34 recommendation, which is incorporated herein by reference;
5. performs preceding and 4D trellis encoding as described in section 9.6 of the V.34 recommendation, which is incorporated herein by reference; and
6. performs nonlinear encoding as described in section 9.7 of the V.34 recommendation, which is incorporated herein by reference.

A variety of suitable implementations in accordance with the requirements of respective sections of the V.34 recommendation will be appreciated by persons of ordinary skill in the art.

Modulator 330 converts the baseband sequence of complex symbols from the output of the encoder into a passband sequence of real samples. In particular, modulator 330:

1. multiplies the complex baseband sequence by the carrier frequency; and
2. converts the complex signal to real.

If the spectrum of the modulator output is sufficiently white, it can be used as an input to receiver echo cancellers, such as preliminary echo canceller 384, described below.

Shaping and pre-emphasis filter 341 provides square-root-of-raised-cosine shaping as well as pre-emphasis filtering specified by section 5.4 of the V.34 recommendation, which is incorporated herein by reference. Raised cosine complex shaping and pre-emphasis filtering are implemented using FIR filters 100 in accordance with FIGS. 1 and 2. Persons of ordinary skill in the art will appreciate suitable coefficient vector definitions for providing raised cosine complex shaping and pre-emphasis filtering. In the embodiment of FIG. 3, eleven pre-emphasis characteristics combined with four choices of carrier frequency (relative to symbol rate) result in a total of 44 separate filters definitions. Only one filter is used on any one connection, although other embodiments utilizing more than one filter definitions per connection are also suitable. The output of shaping and pre-emphasis filter 341 is an output of the transmitter portion of software implementation 300 of a V.34 modem and is provided to D/A converter 391, typically via an I/O channel and codec. D/A converter 391 couples to transmission line 395.

Referring now to the receive data path of software implementation 300, receive front end module 380 receives the output of the A/D converter 392 as an input. A/D converter 392 couples to transmission line 395. Preliminary echo canceller 384 is implemented as a real data/real coefficients adaptive filter using an FIR filter 100 in accordance with FIGS. 1 and 2. Persons of ordinary skill in the art will appreciate suitable coefficient vector definitions. Preliminary echo canceller 384 receives as an input a white signal from the output of the modulator 330. Preliminary echo canceller 384 uses a stochastic gradient updating algorithm for adaptation during half duplex of V.34 training and is not updated during data mode. The purpose of this preliminary stage of echo cancellation is to reduce the echo level relative to the receive signal level so that subsequent stages such as clock recovery, signal detection, and automatic gain control (each not shown) will not be affected by the echo. Final echo signal cancellation is performed by main echo canceller 371 at the output of equalizer 373.

The modem receiver implemented along the receive data path should be to be synchronized with the remote modem signal. An adaptive FIR filter (i.e., an FIR filter implementation 100 in accordance with FIGS. 1 and 2 with an adaptively updated set of filter coefficients) is used to perform the interpolation. Adaptive FIR filters implemented in this manner are used to interpolate the receive signal (at receive signal interpolator 389) as well as to interpolate the modulator output (at echo interpolator 381) used as input for main echo canceller 371. The filter coefficients are adjusted based on timing phase and frequency recovered from the remote modem signal. The adaptation algorithm is a two-stage combination of $$\frac{\sin(x)}{x}$$

and linear interpolations.

Referring now to demodulator 370, a passband phase-splitting adaptive T/3 equalizer 373 is used for channel equalization. The input to equalizer 373 is the output of receive signal interpolator 389 and has a sampling rate of 3TxS. The output of equalizer 373 is downsampled by 3 to symbol rate. Equalizer 373 implemented using FIR filters 100 in accordance with FIGS. 1 and 2. Persons of ordinary skill in the art will appreciate suitable initial coefficient vector definitions for providing passband phase-splitting adaptive T/3 equalizer 373.

Passband adaptive T/3 echo canceller 371 is used to subtract residual echo left over from preliminary echo canceller 384. The echo canceller input is the output signal from modulator 330 synchronized with the remote modem clock. Echo is subtracted at the output of equalizer 373. Demodulator 370 also converts the passband signal at the output of the equalizer to baseband. Demodulator 370 may optionally contain phase locked loop to compensate for frequency offset and phase jitter on transmission line 395.

Decoder 360 converts the demodulated complex symbols into a bit stream which is supplied to receiver process 397. Transmit process 396 receiver process 397 may be the same process. Decoder 360 performs nonlinear decoding, linear prediction, trellis decoding, constellation decoding, shell demapping, and data deframing, all as described in respective sections of the V.34 recommendation, which is incorporated herein by reference. Persons of ordinary skill in the art will recognize variety of alternative implementations of decoder 360, in accordance with the requirements the V.34 recommendation. In addition, persons of ordinary skill in the art will recognize a variety of alternative configurations of decoder 360 suitable to modem implementations in accordance with other communications standards such as V.32, V.32bis, etc. Returning to the V.34 embodiment of FIG. 3, decoder 360:

1. compensates for the effect of nonlinear encoding by applying inverse nonlinear projection function to the symbols at the output of the demodulator;
2. performs linear prediction implemented as a 4-tap complex FIR filter which uses the same coefficients as the remote modem precoder. The purpose of the linear predictor (not shown), which is implemented as an FIR filter 100 in accordance with FIGS. 1 and 2, is to whiten the channel noise, thereby reducing the probability of errors;
3. performs the trellis search algorithm to determine, based on the received symbols, the best decoding decision for the current symbol;
4. performs constellation decoding;
5. performs an operation complementary to that performed by shell mapper described above with reference to encoder 320; and
6. deframes data to provide a single bit stream which is then passed (after descrambling) to receiver process 397.

OTHER EMBODIMENTS

Figure 4:
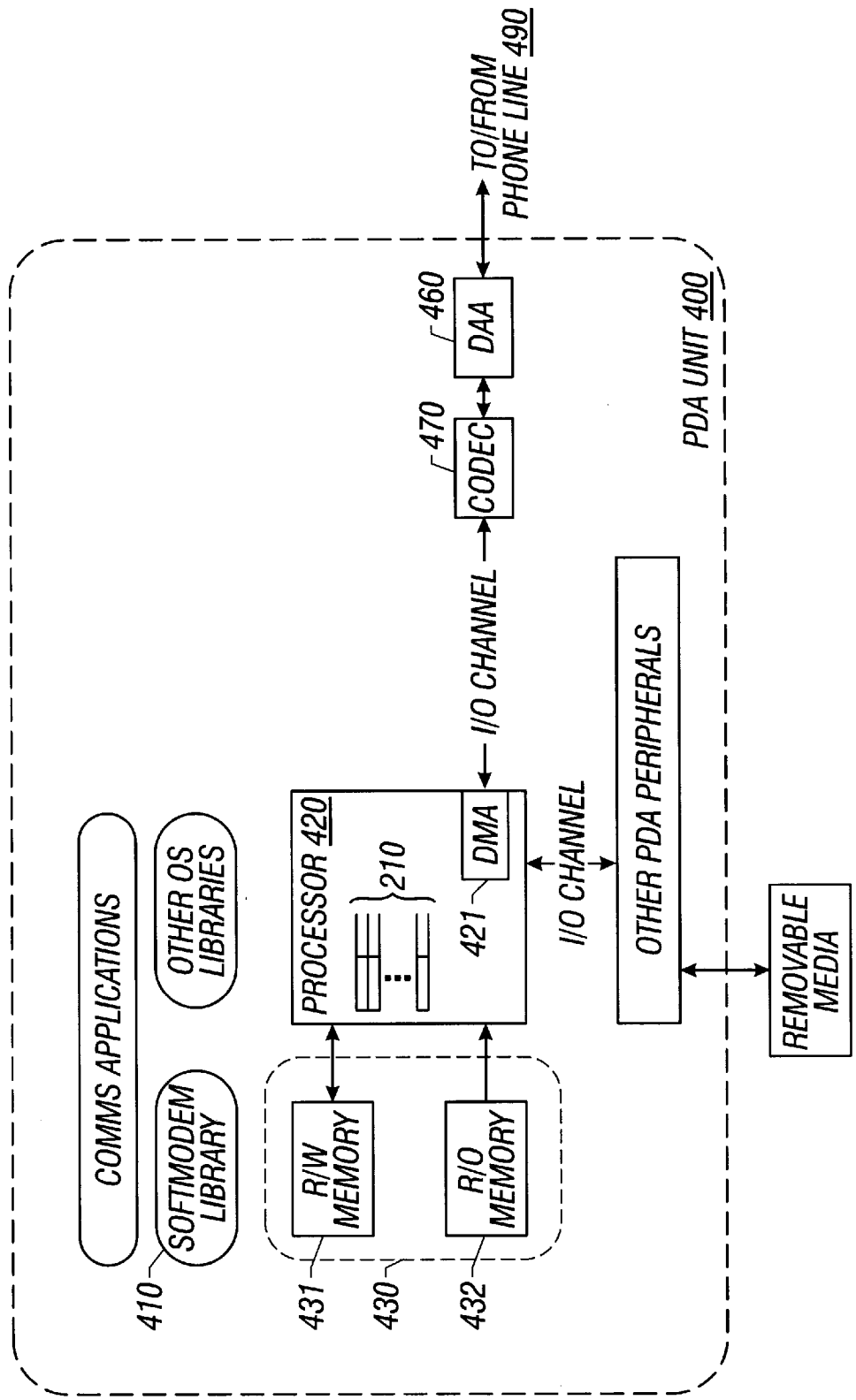
FIG. 4 is a block diagram of an exemplary Personal Digital Assistant (PDA) system embodiment including a general purpose processor, registers, and memory for executing a software implementation of a modem including an implementation of a Finite Impulse Response (FIR) filter in accordance with an exemplary embodiment of the present invention.

FIG. 4 depicts a Personal Digital Assistant (PDA) 400 incorporating a SoftModem library 410 of software modules (illustratively, V.34 SoftModem modules 300) for execution on a general purpose processor 420. In accordance with an embodiment of the present invention, certain of V.34 SoftModem modules 300 are implemented using an FIR filter implementation 100, as described above. Input signal vectors D[K] and filter coefficient vectors C[N] suitable for providing the various FIR filter implementations of interpolators, phase splitting filters, linear predictors, etc. (which have been described above with reference to FIG. 3) are loaded from memory 430 and output signal vectors OUT[K] are stored to memory 430. In addition, executable instructions implementing SoftModem library 410 (including FIR filter implementation 100) and suitable for execution on general purpose processor 420 are also stored in, and loaded from, memory 430. In a presently preferred embodiment, general purpose processor 420 includes an R3000 RISC microprocessor, although a wide variety of alternative processor implementations are also suitable. General purpose processor 420 includes general purpose registers 210 which are operated on by the executable instructions of FIR filter implementation 100 and includes a DMA channel 421 for interfacing to telecommunication circuits (illustratively, phone line 490) via codec 470 and Digital-to-Analog/Analog-to-Digital (DAA) converter 460. Of course, memory 430 may include both read/write memory 431 and read only memory 432 and persons of ordinary skill in the art will recognize code portions and data suitable for storage in each. Removable media 480 provides a mechanism for supplying the executable instructions implementing SoftModem library 410 (including FIR filter implementation 100) as well as filter coefficient definitions.

While the invention has been described with reference to various embodiments, it will be understood that these embodiments are illustrative and that the scope of the invention is not limited to them. Many variations, modifications, additions, and improvements of the embodiments described are possible. For example, complex inputs and/or complex coefficient can be accommodated to generate complex outputs. FIR filter implementations in accordance with the present invention are suitable for implementation of many other signal processing functions and can be incorporated in a wide variety of devices including modems, answering machines, cellular phones, voice/data compression systems, speech recognition systems, etc. Additionally, structures and functionality presented as hardware in the exemplary embodiment may be implemented as software, firmware, or microcode in alternative embodiments. These and other variations, modifications, additions, and improvements may fall within the scope of the invention as defined in the claims which follow.

What is claimed is:

1. A method for implementing an N-tap filter on a processor, the method comprising the steps of:

loading a plurality, $L_2$, of input registers with successive ones of a sequence of input values;

repeating $N/L_2$ times the step of:
repeating $L_1$ times ($L_1 \geq L_2$) the steps of:
accumulating in a respective one of a plurality, $L_1$, of output registers, an inner product of a partial vector of filter coefficients represented in a plurality, $L_2$, of coefficient registers and a partial vector of the input values represented in the $L_2$ input registers; and
loading one of the $L_2$ input registers with a next successive one of the sequence of input values, thereby replacing an earliest one of the sequence of input values with the next successive one of the sequence of input values; and storing result values accumulated in the $L_1$ output registers.

2. A method, as recited in claim 1, further comprising:

repeating, $K/L_1$ times, the loading $L_2$ input registers step, the repeating $N/L_2$ times step, and the storing result values step, wherein K is the number of elements in the sequence of input values.

3. A method, as recited in claim 1, wherein the repeating $N/L_2$ times step further includes the step of:

loading the partial vector of filter coefficients into the $L_2$ coefficient registers, successive partial vectors corresponding to successive repetitions of the partial vector of filter coefficients loading step together comprising a complete filter coefficient vector for the N-tap filter.

4. A method, as recited in claim 1, wherein a successive one of the $L_2$ input registers is loaded during each successive repetition of the one input register loading step, the sequence of successive ones of the $L_2$ input registers repeating once each of the $L_2$ input registers has been loaded.

5. A method, as recited in claim 1, wherein during the Xth successive repetition of the one input register loading step, the particular input register loaded is input register (X-1) mod $L_2$.

6. A method, as recited in claim 1, wherein the loading, repeating, and storing steps are encoded as a computer program in a machine readable medium, the computer program comprising a plurality of executable instructions for implementing an FIR filter in accordance with the method of claim 1.

7. A method for implementing an N-tap filter on a general purpose processor having a first set of $L_2$ general purpose registers allocated to storage of inputs, a second set of $L_2$ general purpose registers allocated to storage of filter coefficients, and a third set of $L_1$ general purpose registers allocated to storage of outputs ($L_1 \geq L_2$), the method comprising: no more than approximately $$K\left[\left(\frac{L_1+L_2}{L_1 L_2}\right)N + \frac{L_2}{L_1} + 1\right]$$

memory access operations for input and filter coefficient loads to, and for output stores from, the general purpose registers allocated thereto; and no more than approximately KN multiply accumulate operations to the general purpose registers allocated to storage of outputs.

8. A computer program implementation of an N-tap filter for execution on a general purpose processor having general purpose registers, the computer program encoded in a machine readable medium and comprising:

concentric inner and outer loop code,
the inner loop code comprising:
coefficient load operations to no more than $L_2$ of the general purpose registers;
no more than $L_2$ input data load operations to general purpose registers; and
partial product accumulate operations to no more than $L_1$ of the general purpose registers ($L_1 \geq L_2$); and
the outer loop code comprising:
input data load operations to no more than $L_2$ of the general purpose registers; and
output data store operations from the no more than $L_1$ general purpose registers.

9. A computer program implementation of an N-tap filter for filtering a K-element input vector on a general purpose processor, the computer program encoded in a machine readable medium and comprising:

($N/L_2$)-iteration inner code concentric within ($K/L_1$)-iteration outer loop code ($L_1 \geq L_2$);
the inner loop code comprising:
load operations to no more than $L_2$ coefficient registers with no more than one load operation per coefficient register;
no more than $L_2$ load operations to input registers; and
accumulate operations to no more than $L_1$ output registers; and
the outer loop code comprising:
load operations to no more than $L_2$ input registers with no more than one load operation per input register; and
store operations from no more than $L_1$ output registers with no more than one store operation per output register.

10. An apparatus for implementing an N-tap filter without a digital signal processor (DSP), the apparatus comprising:
input, coefficient, and output registers allocated from a set of registers provided by a general purpose processor;
means for loading a plurality, $L_2$, of the input registers with successive ones of a sequence of input values;
means for repeating $N/L_2$ times operations of:
means for repeating $L_1$ times ($L_1 \geq L_2$) operations of:
means for accumulating in a respective one of a plurality, $L_1$, of output registers, an inner product of a partial vector of filter coefficients represented in a plurality, $L_2$, of coefficient registers and a partial vector of the input values represented in the $L_2$ input registers; and
means for loading one of the $L_2$ input registers with a next successive one of the sequence of input values, thereby replacing an earliest one of the sequence of input values with the next successive one of the sequence of input values; and
means for writing from the $L_1$ output registers, result values accumulated therein.

11. An apparatus, as recited in claim 10, further comprising:
means for repeating, $K/L_1$ times,
the loading of $L_2$ input registers by the input register loading means,
the repeating, $N/L_2 * L_1$ times, respective operations of the means for accumulating an inner product and of the means for loading one of the $L_2$ input registers with a next successive one of the sequence of input values; and
the writing from $L_1$ output registers by the output registers writing from means.

12. An apparatus comprising:
a general purpose processor having general purpose registers;
memory coupled to the general purpose processor for storing input, coefficient and output vector data;
a first plurality of instructions encoded in media accessible to the general purpose processor implementing an FIR filter executable thereby to incrementally load respective portions of the input and coefficient vector data into first and second sets of the general purpose registers and to operate thereupon to accumulate the output vector data into a third set of the general purpose registers,
wherein, on average, execution of the first instructions includes a first number, less than two, of input and coefficient vector data load operations per accumulation operation.

13. An apparatus, as recited in claim 12,
wherein the FIR filter includes N-taps; and
wherein for large numbers, N, the first number approaches ¼.

14. An apparatus, as recited in claim 12,
wherein the general purpose registers number at least $L_1 + 2L_2$;
wherein the first instructions are structured to define concentric inner and outer loops, $L_1$ being a second number of elements of the output vector data computed during essentially each pass through the outer loop, and L2 being a third number of taps per output vector data element computed during essentially each pass of through the inner loop.

15. An apparatus, as recited in claim 14, wherein for $L_1$ approximately equal to $L_2$, the input and coefficient vector data load operations number approximately $$K\left(\frac{N}{4} + 2\right),$$

where K is the number of elements in the output vector and N is the number of taps of the FIR filter.

16. An apparatus, as recited in claim 15, wherein for large numbers of taps, N, the first number approaches ¼.

17. An apparatus, as recited in claim 12, further comprising:

a second plurality of instructions encoded in media accessible to the general purpose processor and executable thereby, the second plurality of instructions implementing a modem and invoking the FIR filter to provide one of an echo interpolator, an echo canceller, a phase-splitting filter, and a linear predictor.

18. An apparatus, as recited in claim 17, wherein the general purpose processor executes both the first instructions and third instructions;

wherein execution of the first instructions provides signal processing functionality without use of a digital signal processor (DSP); and wherein execution of the third instructions provides application functionality.

19. An apparatus, as recited in claim 17, further comprising:

a digital-to-analog converter and an analog-to-digital converter for coupling the general purpose processor to a communications medium, wherein the apparatus, including the modem implemented by the first and second pluralities of instructions, is a portable device with communications capabilities.

20. An apparatus, as recited in claim 12, wherein execution of the first instructions provides an efficient implementation of a digital filter, without use of a DSP, for one of a personal digital assistant, a portable computer, a modem, mobile phone or other communications device, a modem, a voice or data compression system, a speech recognition system, and a portable device with signal processing functionality.

21. A method for implementing an N-tap filter on a processor, the method comprising the steps of:

loading a plurality, $L_2$, of input registers with successive ones of a sequence of input values;

repeating $N/L_2$ times the step of:

repeating $L_1$ times ($L_1 \geq L_2$) the steps of:

accumulating in a respective one of one or more output registers, an inner product of a partial vector of filter coefficients represented in a plurality, $L_2$, of coefficient registers and a partial vector of the input values represented in the $L_2$ input registers; and loading one of the $L_2$ input registers with a next successive one of the sequence of input values, thereby replacing an earliest one of the sequence of input values with the next successive one of the sequence of input values; and storing result values from the one or more output registers.

22. A method, as recited in claim 21, wherein the one or more output registers number $L_1$; and wherein the result value storing includes storing $L_1$ result values accumulated in the $L_1$ output registers.

* * * * *